(12) United States Patent
Allen et al.

(10) Patent No.: US 9,123,850 B2
(45) Date of Patent: Sep. 1, 2015

(54) SYSTEMS AND METHODS FOR GENERATING ELECTRIC CURRENT FROM HYPERTHERMAL CHEMICAL REACTION

(75) Inventors: Edward H. Allen, Bethesda, MD (US); Andrew G. York, College Park, MD (US)

(73) Assignee: Lockheed Martin Corporation, Bethesda, MD (US)

(*) Notice: Subject to any disclaimer, the term of this patent is extended or adjusted under 35 U.S.C. 154(b) by 1505 days.

(21) Appl. No.: 12/621,877

(22) Filed: Nov. 19, 2009

(65) Prior Publication Data

US 2012/0186250 A1    Jul. 26, 2012

(51) Int. Cl.
*H01S 3/0937* (2006.01)
*H01S 3/095* (2006.01)
*H01S 3/0953* (2006.01)
*B64G 1/40* (2006.01)
*F03H 1/00* (2006.01)
*H01L 31/054* (2014.01)

(52) U.S. Cl.
CPC ............ *H01L 31/0547* (2014.12); *B64G 1/405* (2013.01); *F03H 1/00* (2013.01); *F03H 1/0018* (2013.01); *F03H 1/0081* (2013.01); *H01S 3/095* (2013.01); *H01S 3/0937* (2013.01); *H01S 3/0953* (2013.01); *Y02E 10/46* (2013.01); *Y02E 10/52* (2013.01)

(58) Field of Classification Search
CPC ....... H01S 3/0937; H01S 3/091; H01S 3/095; H01S 3/0953; B64G 1/405; F03H 1/00; F03H 1/0081; F03H 1/0087; F03H 1/0093; F03H 1/0012; F03H 1/0018

USPC ......... 60/202, 203.1; 136/243, 248, 252–254; 372/2, 109, 89

See application file for complete search history.

(56) References Cited

U.S. PATENT DOCUMENTS

| | | | | |
|---|---|---|---|---|
| 3,436,918 | A | * | 4/1969 | Powers, Jr. et al. ............ 376/319 |
| 4,013,976 | A | * | 3/1977 | Hill et al. ......................... 372/90 |
| 2003/0046921 | A1 | * | 3/2003 | Hruby et al. ..................... 60/202 |
| 2006/0150611 | A1 | * | 7/2006 | Allen ............................ 60/203.1 |
| 2010/0236625 | A1 | * | 9/2010 | Kenney et al. ................. 136/259 |

OTHER PUBLICATIONS

Banna, Particle Acceleration by Stimulated Emission of Radiation: Theory and Experiment, 2006, Physical Review E, 74, pp. 1, 9, 11.*
Lahankar, Electronic Population Inversion in HCCO/DCCO Products From Hyperthermal Collisions of O(3P) with HCCH/DCCH, 2013, Physical Chemistry Letters, pp. 1315, 1320.*
Kowalski, Hot-Atom Chemiluminescence: A beam Stury of the O(3P) + H2, CH4 Systems, 2004, Verlag der Zeitschrift Fur Naturforschung, 59a, pp. 517-519.*
Fundamentals of Photonics, Saleh, 1991, John Wiley and Sons, 461, 461, 468, 488, 489.*
Understanding Lasers, Hecht, 2008, IEEE press, Section 4.5.5.*

* cited by examiner

*Primary Examiner* — Ehud Gartenberg
*Assistant Examiner* — William Breazeal
(74) *Attorney, Agent, or Firm* — Baker Botts L.L.P.

(57) ABSTRACT

An electric generator is disclosed that includes a duct configured to direct hyperthermal air molecules toward a source of exothermic fuel, a fuel dispenser configured to dispense fuel into a flow of the hyperthermal air molecules to cause a hyperthermic chemical reaction between the fuel and the hyperthermal air molecules that produces highly internally excited air molecules. The excited molecules amplify a seed current. Power harvesting cells are configured to capture and convert the amplified current to electricity.

14 Claims, 2 Drawing Sheets

SYSTEMS AND METHODS FOR GENERATING ELECTRIC CURRENT FROM HYPERTHERMAL CHEMICAL REACTION

BACKGROUND

Faster propulsion typically requires dramatically greater amounts of power. For hypersonic flight over Mach 5, propulsion methods like plasma-fuel engines will fly faster than what is currently proposed with scramjet technology but will need vast amounts of electrical power. Current methods of generating this power appear to be inadequate. Fuel cells that use oxygen from the air have the potential advantage of high efficiency, but they cannot be used for high-speed operation because they require stopping the air molecules to produce the reactions that generate electricity. At speeds faster than approximately 2000 m/s, the energy cost of stopping the air, which constitutes drag, will exceed the energy that can be gained from conventional chemical reactions.

SUMMARY

An electric generator is disclosed that includes a control volume configured to direct hyperthermal air molecules toward a source of exothermic fuel, a fuel dispenser configured to dispense fuel into a flow of the hyperthermal air molecules to cause a hyperthermic chemical reaction between the fuel and the hyperthermal air molecules that produces highly internally excited air molecules. The excited air molecules amplify a seed current. Power harvesting cells are configured to capture and convert amplified seed current to electricity.

BRIEF DESCRIPTION OF THE DRAWINGS

Embodiments disclosed herein may be better understood, and their numerous objects, features, and advantages made apparent to those skilled in the art by referencing the accompanying drawings. The use of the same reference symbols in different drawings indicates similar or identical items.

DETAILED DESCRIPTION OF THE FIGURES

Figure 1:
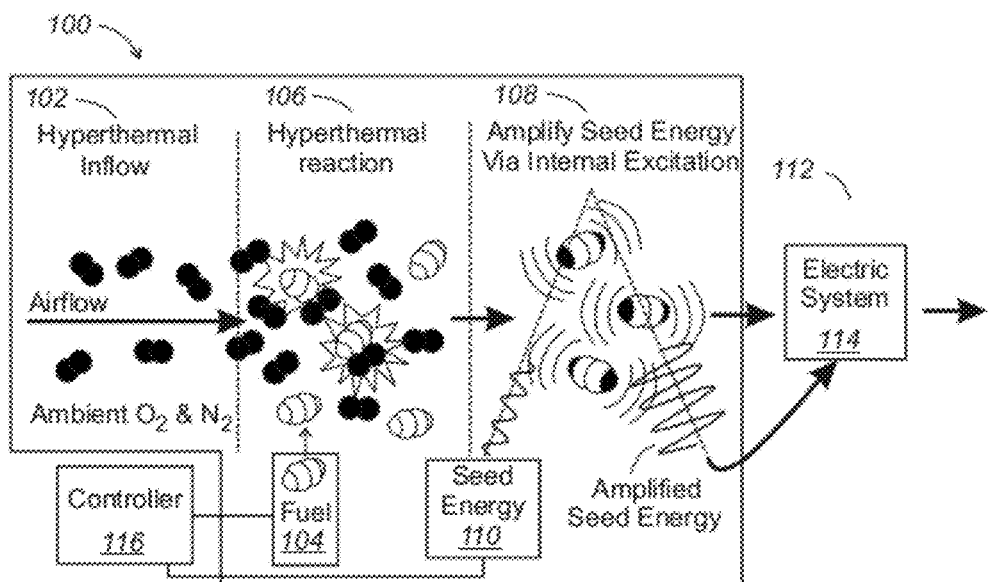
FIG. 1 is a diagram of components and processes included in an embodiment of an electric generator that generates electricity from a hyperthermal chemical reaction.

FIG. 1 is a diagram of components and processes included in an embodiment of an electric generator 100 that generates electricity from a hyperthermal chemical reaction. Electric generator 100 can provide enough energy from a chemical reaction between an onboard source of fuel and ambient oxygen during hypersonic flight to support primary power requirements for an electric propulsion system as well as other on-board systems.

In exothermic reactions, energy is released as the molecules combine to a less energetic state. The term "hyperthermal" is used to describe chemical reactions that take place at the molecular collision energies of relevance to hypersonic flight at several kilometers per second or more.

During process 102, air molecules are directed at hypersonic speed toward exothermic fuel source 104. The hyperthermal air molecules can be directed toward fuel source 104 along an inlet or channel in a control volume of the propulsion system for an air vehicle during hypersonic flight. The control volume is defined by the dimensions of the inlet or channel. In process 106, a chemical reaction occurs within the control volume during collision between the air and fuel molecules and generates a highly excited product, such as an energetic population inversion (or partial inversion). Population inversion occurs when a group of atoms or molecules exists with more members in an excited state than in lower energy states.

Reactions of dioxide molecules and oxygen atoms with appropriate fuel molecules at very high relative velocities are unlike customary oxidation reduction (redox) reactions in many ways and will liberate stored chemical energy in the form of highly internally excited reaction products rather than just heat. Customary equilibrium combustion results primarily in translational excitation (heat) and does not generate as much internal excitation.

In some implementations, oxygen enters generator 100 at a high relative velocity, for example, seven (7) kilometers per second or more. If the generator 100 is positioned downstream of the propulsion system, the air entering the control volume can be accelerated and reach several times the initial relative velocity. The oxygen is mainly in molecular form ($O_2$), but there may be some atomic oxygen (O) and ozone ($O_3$), depending on altitude and on the number of energetic gas-surface boundary layer collisions and shock layer penetrations that occur as the air enters generator 100. Molecular nitrogen ($N_2$) will also enter the engine, but it is relatively inert and, depending on the fuel being used, can be disregarded with respect to the chemical reaction. The molecular oxygen reacts with fuel molecules at high relative velocities and produces reaction products that are highly internally excited. The excitation may be in the form of rotational, vibrational, and/or electronic energy. Under some conditions, excited states will be populated preferentially over the ground state, and a population inversion will result. The reaction products contain a great deal of energy due in part from the collision energy of the oxygen with the fuel molecules and in part from the chemical energy released by the exothermicity of the reactions between the oxygen and the fuel molecules.

In process 108, resonant seed energy (such as photons or electrons) 110 is provided to be amplified by interactions with the excited molecules as the seed energy 110 passes through the gas. The term resonant means that the frequency of seed energy 110 is the same as or similar to the excitation frequency of the reaction products from the oxygen and fuel molecule collisions. Seed energy 110 can include current pulses, appropriately shaped and conditioned, that are injected into the fuel-air flow. The current pulses can be formed with electrons, photons, or other suitable current-carrying particles. Energy in the reaction products is extracted by energy transfer between internally excited molecules of the inversion and resonant particles in the seed energy 110. The seed particles gain energy and can be collected and converted to work. In some implementations, the energy gain is manifest as amplification of the power pulses of seed energy 110 and in other implementations, the energy gain is manifest as acceleration and/or multiplication of charged particles in the seed current 110.

Energy from the excited molecules is harvested and conditioned into useful electric power in process 112. The electric power can be supplied to a suitable electric device 114 for any suitable purpose, such as, for example, to an electric propulsion system to generate thrust for an air vehicle. One example of an electric propulsion system that can be integrated with generator 100 is described in Allen U.S. Pat. No. 7,509,795 entitled "Systems and Methods for Plasma Propulsion", which issued Mar. 31, 2009 and is incorporated by reference herein.

As an example of fuel source 104 that may be used in electric generator 100, the reaction of hyperthermal oxygen atoms (in their ground, $^3P$, state) with deuterated acetylene (DCCD) as fuel source 104 may proceed through two reaction pathways:

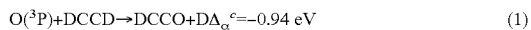
$$O(^3P)+DCCD \rightarrow DCCO+D \Delta H_\alpha^c=-0.94 \text{ eV} \quad (1)$$

$$\rightarrow CD_2+CO \Delta H_\alpha^c=-2.06 \text{ eV} \quad (2)$$

Reaction (1) occurs in roughly 80% of the reactive collisions and has been investigated at several hyperthermal collision energies. With center-of-mass collision energy of 4.0 electron volts (corresponding to a relative velocity of 8 km s$^{-1}$) the DCCO product may be formed in approximately 50% of reactive collisions, in an electronically excited metastable state. The remaining DCCO product molecules may be in highly excited vibrational and rotational states. A large fraction of the products are formed with internal energies above the dissociation limit for DCCO in its ground state; however, they are metastable and in an excited (quartet) electronic state.

It is possible to obtain population inversion in the electronic states of DCCO, where the number of product radicals in an excited electronic state is higher than the number of products in a lower electronic state. Such a situation may be amenable to the production of a chemical laser, which may have applications elsewhere. Notably, a large fraction of the available energy (i.e., the sum of the collision energy and the reaction exothermicity) is found in internal excitation of the products.

Another reaction in which internal degrees of freedom of the reaction product contain a large fraction of the available energy is the hyperthermal reaction of molecular oxygen with carbon dioxide, which is represented by Reaction (3):

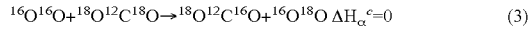
$$^{16}O^{16}O+^{18}O^{12}C^{18}O \rightarrow ^{18}O^{12}C^{16}O+^{16}O^{18}O \Delta H_\alpha^c=0 \quad (3)$$

Reaction (3) is an O-atom exchange reaction where the reactants and products would be indistinguishable except where they can be identified by the isotope exchange. Although the reaction is thermo-neutral, there is a very high reaction barrier of 5.2 eV. At a relative velocity of 8.26 km s$^{-1}$, the center-of-mass collision energy is 6.85 eV, so the reaction may occur. The fraction of the collision energy that goes into internal excitation of the product $CO_2$ and $O_2$ is about 84%, so the reaction products can have very large internal energies.

If energy for electric propulsion is supplied from stored chemical energy, then the energy can be released from a highly exothermic reaction. In some embodiments, the reaction products are small molecules or radicals that can accept a high degree of internal excitation without dissociating. Further, as the primary oxidizing agent available to the generator is a dioxide ($O_2$), then fuel 104 can be selected to react directly and exothermically with $O_2$. Fuel 104 can be stable in air except when it is exposed to $O_2$ at very high relative velocities. Therefore, a chemical reaction is desired in which molecular oxygen reacts with a convenient fuel only at high collision energies and then releases as much of the available energy as possible in internal degrees of freedom of the products. Carbon disulfide ($CS_2$) can be used as fuel 104, which may react with molecular oxygen according to the following Reactions (4) and (5),

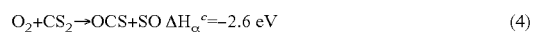
$$O_2+CS_2 \rightarrow OCS+SO \Delta H_\alpha^c=-2.6 \text{ eV} \quad (4)$$

$$\rightarrow CO+SO_2 \Delta H_\alpha^c=-5.4 \text{ eV} \quad (5)$$

The transition state for Reaction (4) has been calculated to be ~2.6 eV, and the barrier for Reaction (5) is unknown but would likely be higher. At relative velocities of 7 and 8 km s$^{-1}$, the center-of-mass collision energies would be 5.72 eV and 7.47 eV, respectively. Thus, at the hypersonic velocities of relevance, Reactions (4) and Reaction (5) are possible. In either Reaction (4) or (5), the exothermicity is large, and the products would be expected to be highly internally excited. Note that Reaction (4) is analogous to Reaction (3), which showed that most of the available energy (84%) went into internal excitation of the reaction products.

The primary Reactions (4) and (5) involving molecular oxygen may help liberate stored chemical energy from the $CS_2$ fuel. If atomic oxygen is present in the ambient environment or, if atomic oxygen is generated through the interaction of $O_2$ with vehicle surfaces, shocks, etc., then a primary O-atom reaction might be relevant, as shown by Reaction (6):

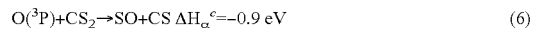
$$O(^3P)+CS_2 \rightarrow SO+CS \Delta H_\alpha^c=-0.9 \text{ eV} \quad (6)$$

Reaction (6) has a barrier of only ~0.05 eV, so the reaction should proceed with ease at hyperthermal collision energies. At lower collision energies, approximately 60% of the available energy may go into internal excitation of the products. Note that other types of fuel can be used, such as sulfur oxide (SO), sulfur dioxide ($SO_2$), and carbon sulfide (CS), for example, as well as many others.

Controller 116 can control the supply of fuel 104 and seed energy 110 in generator 100 based on desired operating condition of electrical system 114. For example, controller 116 can receive a command or other information from electric system 114 to increase or decrease the energy supplied to electric system 114. Controller 116 can then increase or decrease the amount of fuel and/or seed energy 110 dispensed to meet the demands of electric system 114. A fuel dispenser (not shown) such as a valve can be coupled between fuel 104 and controller 116. Controller 116 can operate electric generator 100 to provide a continuous, varying, and/or periodically intermittent electric power. The strength and/or the pulse frequency of the electric power can be varied, depending on the force required from the propulsion system.

Controller 116 is typically a processing system that can be embodied in any suitable computing device(s) using any suitable combination of firmware; software, and/or hardware, such as microprocessors, Field Programmable Gate Arrays (FPGAs), Application Specific Integrated Circuit (ASICs), or other suitable devices. One or more feedback sensors (not shown) can be coupled to provide controller 116 with information such as pressure, temperature, conductivity, field strength, and/or other parameters required for operation.

Figure 2:
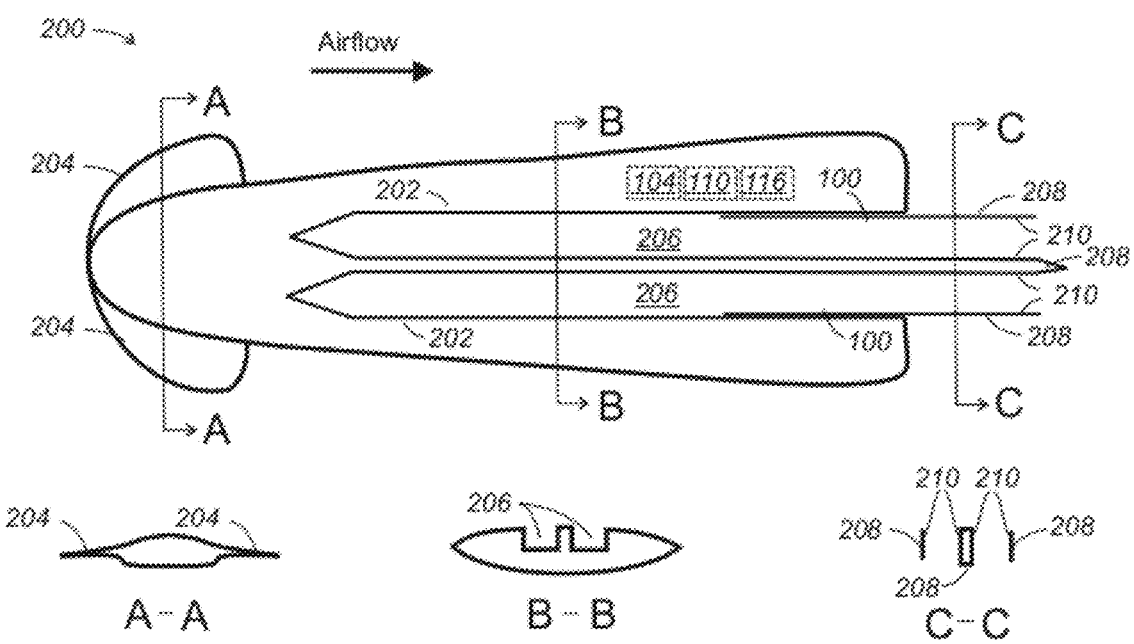
FIG. 2 is a top view of an embodiment of a hypersonic aircraft including the electric generator of FIG. 1.
Figure 3:
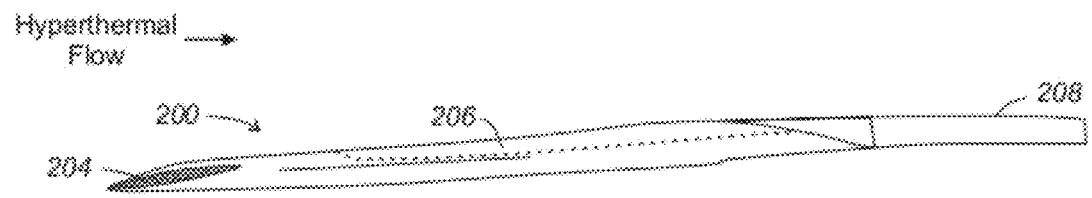
FIG. 3 is a side view of the hypersonic aircraft of FIG. 2.

FIGS. 2 and 3 show respective top and side views of an embodiment of a hypersonic aircraft 200 configured to accommodate electric generator 100 of FIG. 1 to supply electric power to plasma fuel engines (PFEs) 202. Aircraft 200 is configured with PFEs 202, electric generators 100, fuel 104, seed energy 110, controller 116, canards 204, open duct inlets 206, and opposing pairs of power harvesting cells 208, such as photovoltaic cell panels with partially reflective surfaces 210.

Aircraft 200 typically cruises at altitudes in the atmosphere just below low earth orbit. Canards 204 can be positioned on both sides of the nose of aircraft 200 with a negative angle of attack to maintain the nose of aircraft 200 at a negative angle of attack during flight. Maintaining aircraft 200 at a negative angle of attack cancels centrifugal force at speeds greater than orbital speed, which helps aircraft 200 stay within the earth's atmosphere during acceleration. Additionally, PFEs 202 and generators 100 can be positioned on the top side of aircraft 200 to allow air inlets 206 to benefit from a large projected inflow cross-section and higher density flow on top of aircraft 200 because of the negative angle of attack. Inlet cross-section in an open duct is proportional to the projected area of the inlet in the direction of flow. As the angle of attack changes, that projected area also changes. Additionally, the flow must pass through the shock enveloping the airplane, which causes the density and pressure of the flow to rise. Higher density means more molecules are available to process—either in the propulsion system or in generator 100.

One or more open duct inlets 206 are formed as 3-sided rectangular channels that allow air molecules to flow along at least a portion of the length of aircraft 200 within inlets 206. The upstream end of inlets 206 can be tapered to a point or rounded shape to improve aerodynamic flow around inlets 206 and control the characteristics of the associated shock waves. PFEs 202 can be positioned along the portion of inlets 206 closest to the nose of aircraft 200. Generators 100 can be positioned along inlets 206 behind PFEs 202. The performance of generators 100 can benefit from the higher enthalpy of the exhaust of PFEs 202, which is higher than the enthalpy of free stream air. The performance benefit is due to the free stream air being accelerated, and to the extent the acceleration device (PFE 202 in some embodiments) is inefficient, heated. Accelerating and heating the air increases the proportion of the hyperthermal energy that appears as internal excitation, leading to a more intense inversion, even when the vehicle is operated at flight speeds below which hyperthermal reaction effects would be dominant. Note that in other embodiments, generators 100 can be positioned in front of PFEs 202, however.

Figure 4:
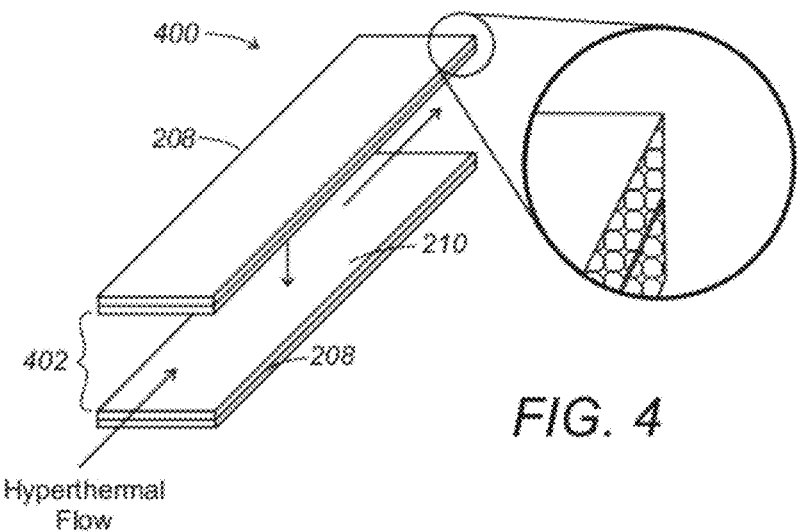
FIG. 4 is a perspective view of an embodiment of a pair of partially reflective photovoltaic cell panels that can be used in the electric generator of FIG. 1 and aircraft of FIG. 2.

Referring FIGS. 1 and 4, FIG. 4 is a perspective view of an embodiment of a pair of power harvesting cell panels 208 that can be used in electric generator 100 of FIG. 1 and aircraft 200 of FIG. 2. In process 112, light energy amplified by internally excited molecules can be captured and converted to electricity using two parallel panels 208 of power harvesting cells separated from one another by gap 402. The internally excited reaction products propagate along panels 208, and the amplified light propagates in a direction roughly orthogonal to the airflow. The highly internally excited reaction products amplify light at a resonant frequency. The power harvesting cells (PHCs) on panels 208 can efficiently convert the amplified light into electricity when the PHCs are configured to absorb light at the resonant frequency of the excited molecules. The opposing pairs of PHC panels 208 can include partially reflective surfaces 210 to further increase the efficiency of light amplification. Note that in some embodiments, monochromatic photovoltaic cells can be used and are much more efficient that broad band solar cells.

In order to provide sufficient surface area to generate electricity, PHC panels 208 can extend past the aft end of aircraft 200. In such configurations, two sides of lasing chamber 400 can be open to the free stream air, but may also include additional sides to close chamber 400 from free stream air. The additional panels used to enclose chamber 400 may be mirrored and lined with photovoltaic (PV) material. Mirrored surfaces 210 are typically only partially reflective to allow some of the energy to be absorbed by the PVCs. Note that some energy of the lasing light is absorbed with each reflection, thereby providing a cooling effect.

The performance potential of generator 100 integrated with PFE 202 may be expressed in terms of the maximum specific impulse, $I_{sp}$, which is the most widely-accepted performance metric for air and space propulsion systems. All the energy added to the flow by PFE 202 (or other electromagnetic accelerator) comes from electric fields, and none from the magnetic fields.

To derive an expression for maximum specific impulse, the following expression for thrust derived from the PFE is used:

$$\text{Thrust} = \left(\frac{e}{mv_m}\right)IB^2L = \mu vIB^2L \qquad (1)$$

where e/m is the charge-to-mass ratio of the electron (a fundamental constant of physics), $v_m$ is the electron-molecule collision frequency at the operational density altitude, $$\mu = \left(\frac{e}{mv_m}\right)$$

is the mobility, I is the current, B the magnetic field, and L the effective length of the PFE acceleration chamber, which is a design parameter.

Electric generator 100 uses an excited population of reaction products resulting from hyperthermal reactions of oxygen and an exothermic fuel such as carbon disulfide. While there are typically multiple reaction paths, for simplicity, a single energy (4.0 eV) is used in the calculations here taking Reaction 4 and 5 as an example. In principle, the maximum power available occurs when each oxygen molecule is reacted, so the maximum power can be estimated as the product of the oxygen flow rate (molecules per second) and the average net reaction energy per oxygen molecule . . . .

$$Pwr=0.209\rho_N u_x E_R=0.2\rho_N u_x 4.0 \text{ eV}\phi \qquad (2)$$

where $\rho_N$ is the number density at altitude and $u_x$ the airspeed; the factor 0.209 expresses the proportion of oxygen molecules in atmospheric gas (roughly constant at all altitudes of interest up to about 90 km where dissociated molecules begin to be more common). This produces a power value of ~125.5 MW/m² at 120 kft of altitude and orbital speeds (~7 km/s). Next, note that reacting all the oxygen is not practical because, to do so, the chamber must be flooded with fuel so that each oxygen molecule is likely to find an unreacted fuel molecule within its residence time in the chamber. Such flooding would result in a good deal of unreacted fuel and, thus, be inefficient, so assume a "stoichiometry" less than unity (i.e., a surplus of oxygen, rather than fuel). Thus, in the power expression (2) above, an arbitrary stoichiometry term at a reasonable value, $\phi=0.5$, is assumed. The stoichiometry term, of course, drops the maximum power flow by half to ~62.9 MW/m².

To get from the power equation above to the electrical current value required to evaluate the thrust equation (1), simplifying assumptions about the extraction voltage (the average voltage at which current is extracted), $V_{ex}$ can be made. Any assumption of extraction voltage value immediately sets the effective PFE current value because $I=Pwr/V_{ex}$. An extraction voltage in the range of 100 volts on the 62.9 megawatts/m² power flow implies a current in the range 629 kA/m². A current that large, about the same as that in a production arc furnace, induces magnetic as well as heating effects, but both are useful in any final design.

Once the current is known, equation (1) gives the thrust directly as being proportional to the square of the product of imposed magnetic flux density (Tesla) and the linear extent of the field (the acceleration chamber length in meters). Using a magnetic field of ~0.03 T in chamber length of ~0.3 m, as was done in one demonstration test for example, the result is a thrust estimate of roughly 0.03 N.

Impulse from a rocket or other propulsion engine is defined as the thrust produced by the engine per unit of mass flow of its propellant. Rockets carry the entire propellant load aboard the vehicle and, thus, for a given amount of thrust output, exhibit a substantial mass flow and, therefore, a large rate at which the mass of the vehicle is depleted during operations. By contrast, airbreathing vehicles, in the act of harvesting oxidizer from the atmosphere, also "borrow" the nitrogen molecules from the atmosphere and thus most of the mass flow through the engine, so the vehicle's mass changes much more slowly and only by the amount of the fuel during operations. For that reason, the specific impulse of an airbreathing vehicle is often an order of magnitude higher than a rocket. Using the same considerations and equations used for the power calculation, the mass flow of the example using carbon disulfide fuel can be determined from the number density of $O_2$ flow, the mass of $CS_2$ required per $O_2$ molecule (averaged across the two possible reactions) and the selected stoichiometry $$M_{fuel} = 0.209 \rho_N u_x (63.3 \text{ AMU}) \phi \quad (3)$$

The Specific Impulse, $I_{sp}$, is defined, then, as $$I_{sp} = \frac{\text{Thrust}}{\dot{M}} \frac{1}{g} \quad (4)$$
$$= \frac{\mu \frac{Pwr}{V_{ex}} B^2 L}{0.2 \rho_N u_x (63.3 AMU) \phi g}$$
$$= \frac{\mu \frac{(4.0 \text{ eV})}{V_{ex}} B^2 L}{(63.3 AMU) g} \propto E_{sp} \frac{B^2}{V_{ex}} \frac{L}{g}$$

where $E_{sp}$ is the reaction energy per unit of reactant mean mass (4.0 eV/63.3 AMU) that may be used to determine the best fuel selection.

Equation (4) implies the specific impulse of an integrated PFE 202 and electric generator 100 system is, like that of a rocket, set by the fuel selection and theoretically constant over all Mach numbers. As expected of an airbreathing system, though, the performance of the integrated PFE 202 and electric generator 100 is quite a bit better than that of a rocket. Unlike a rocket, performance of the integrated PFE 202 and electric generator 100 is further defined by a quadratic proportionality to the magnetic field, and an inverse proportionality to the extraction voltage. Atmospheric plasma exhibits an electric field (more or less independent of current) of 13 volt/centimeter-Torr (±20%) and thus the extraction voltage is a function of altitude and the extraction path length.

In addition to the enabling role of the magnetic field, the impulse performance is the inverse proportionality to the effective extraction voltage. So the effort to raise extraction voltages in order to minimize $I^2R$ heating and sui generis magnetic fields may be counterproductive.

Depending on the actual operating conditions of the engine, secondary reactions might also occur. Likely secondary reactions may result from collisions of O and $O_2$ with SO, $SO_2$, and CS. All these reactions are exothermic, and they have been studied earlier. The reaction that has received the most attention is O+CS→CO+S, because this reaction produces a vibrational population inversion in CO that can be used to make a chemical laser. In fact, because of this important secondary reaction, a chemical laser involving excited CO has been demonstrated when mixtures of $O_2$ and $CS_2$ are allowed to react, for example, in a flame. The observation of a population inversion in CO is a consequence of the high internal excitation in the products of reactions involving compounds containing O, C, and S. Unlike all other laser systems, chemical lasers can achieve very high efficiency. The efficiencies are measured from the theoretical Gibbs free energy of the reaction to the total energy of the resulting optical pulse. Studies of photovoltaic approaches to converting the monochromatic laser light into electrical power shows 63% efficiency at flux rates near 100 watts/cm$^2$; another shows efficiencies well above that.

Figure 5:
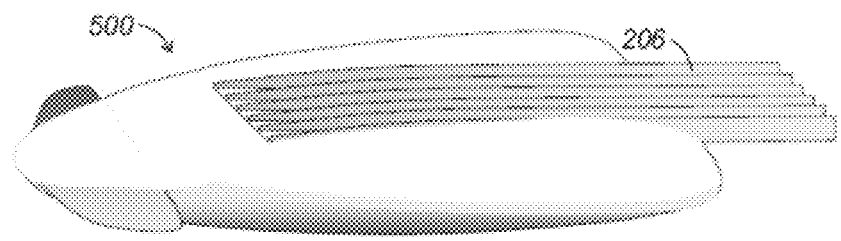
FIG. 5 is a perspective view of another embodiment of a hypersonic aircraft that can use the electric generator of FIG. 1.

Referring now to FIG. 5, another embodiment of a hypersonic aircraft 500 that can use the electric generator 100 of FIG. 1 is shown including a series of five (5) inlets 206 along a majority of the length of the upper surface of aircraft 500. Note that aircraft 200 (FIG. 2), 500 can be configured with any suitable number of inlets 206, depending on the thrust required during flight. The energy generated by two or more electric generators 100 can be provided to a single electrical device 114, again depending on the energy requirements of the electrical device 114.

While the present disclosure describes various embodiments, these embodiments are to be understood as illustrative and do not limit the claim scope. Many variations, modifications, additions and improvements of the described embodiments are possible. For example, those having ordinary skill in the art will readily implement the processes necessary to provide the structures and methods disclosed herein. Variations and modifications of the embodiments disclosed herein may also be made while remaining within the scope of the following claims. The functionality and combinations of functionality of the individual modules can be any appropriate functionality. In the claims, unless otherwise indicated the article "a" is to refer to "one or more than one".

What is claimed:

1. An air vehicle, comprising:
   a plasma propulsion system having a control volume;
   a fuel dispenser configured to dispense exothermic fuel molecules into a flow of hyperthermal air molecules in the control volume for leading to a hyperthermal-chemical reaction in the control volume between the hyperthermal air molecules and the exothermic fuel molecules to produce internally excited reaction products in an energetic population inversion;
   a resonant seed current source, said resonant seed current source being distinct from the internally excited reaction products, and under the influence of a controller, the resonant seed current source being configured to controllably inject resonant photons into the internally excited reaction products in the control volume, so as to extract laser radiation from the internally excited reaction products; and
   opposing surfaces within the control volume comprising a plurality of power harvesting cells downstream of a location where the exothermic fuel molecules and the hyperthermal air molecules form the internally excited reaction products, each opposing surface comprising at least one of the plurality of power harvesting cells, the plurality of power harvesting cells being configured to capture the laser radiation and convert at least a portion of the laser radiation to an electrical current feeding the plasma propulsion system.

2. The air vehicle of claim 1, wherein the internally excited reaction products amplify the resonant photons with a predetermined frequency that is matched to the plurality of power harvesting cells.

3. The air vehicle of claim 1, further comprising: a partially reflective surface on the opposing surfaces that covers the plurality of power harvesting cells.

4. The air vehicle of claim 1, wherein the controller is also configured to regulate the fuel dispenser.

5. The air vehicle of claim 1, wherein the plasma propulsion system includes an inlet and an exhaust, and the plasma propulsion system is configured to receive the electrical current from the plurality of power harvesting cells via a circuit.

6. The air vehicle of claim 1, wherein the plasma propulsion system is configured to supply an exhaust to the control volume.

7. The air vehicle of claim 1, wherein the plurality of power harvesting cells are photovoltaic cells.

8. A method comprising:
   directing a flow of hyperthermal air molecules from a plasma propulsion system toward a source of exothermic fuel molecules in a control volume of the plasma propulsion system;
   dispensing exothermic fuel molecules, via the source of exothermic fuel molecules, into the flow of the hyperthermal air molecules in the control volume, thereby leading to a hyperthermal-chemical reaction between the exothermic fuel molecules and the flow of hyperthermal air molecules that produces internally excited reaction products in an energetic population inversion;
   injecting resonant photons, from a resonant photon source distinct from the internally excited reaction products, into the internally excited reaction products in the control volume, the resonant photons being injected under the influence of a controller, so as to extract laser radiation from the internally excited reaction products with the resonant photons;
   propagating the internally excited reaction products between opposing surfaces, comprising a plurality of power harvesting cells, each opposing surface comprising at least one of the plurality of power harvesting cells;
   interacting at least a portion of the laser radiation from the internally excited reaction products with the plurality of power harvesting cells so as to produce an electrical current; and
   feeding the electrical current to the plasma propulsion system.

9. The method of claim 8, wherein the internally excited reaction products amplify the resonant photons with a predetermined frequency that is matched to the plurality of power harvesting cells.

10. The method of claim 8, wherein the opposing surfaces further comprise a partially reflective surface that covers the plurality of power harvesting cells.

11. The method of claim 8, further comprising: regulating an output of the source of exothermic fuel molecules to regulate the hyperthermal-chemical reaction.

12. The method of claim 8, wherein the resonant photons are supplied by a seed current generator.

13. The method of claim 8, further comprising: supplying the electrical current from the plurality of power harvesting cells to the plasma propulsion system to generate thrust.

14. The method of claim 8, wherein the plasma propulsion system is configured to supply an exhaust to the control volume.

* * * * *